(12) United States Patent
Guo

(10) Patent No.: US 9,397,106 B2
(45) Date of Patent: Jul. 19, 2016

(54) METHOD FOR PRODUCING MROM MEMORY BASED ON OTP MEMORY

(71) Applicant: CSMC TECHNOLOGIES FAB1 CO., LTD., Jiangsu (CN)

(72) Inventor: Shuming Guo, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 57 days.

(21) Appl. No.: 14/398,753

(22) PCT Filed: May 9, 2013

(86) PCT No.: PCT/CN2013/075364
§ 371 (c)(1),
(2) Date: Nov. 4, 2014

(87) PCT Pub. No.: WO2013/166974
PCT Pub. Date: Nov. 14, 2013

(65) Prior Publication Data
US 2015/0143320 A1 May 21, 2015

(30) Foreign Application Priority Data

May 9, 2012 (CN) .......................... 2012 1 0141757

(51) Int. Cl.
| | |
|---|---|
| G06F 17/50 | (2006.01) |
| H01L 27/115 | (2006.01) |
| H01L 27/02 | (2006.01) |
| G11C 17/12 | (2006.01) |
| H01L 27/112 | (2006.01) |

(52) U.S. Cl.
CPC .............. *H01L 27/115* (2013.01); *G11C 17/12* (2013.01); *H01L 27/0207* (2013.01); *H01L 27/11233* (2013.01); *G06F 17/5068* (2013.01)

(58) Field of Classification Search
CPC .............. H01L 27/115; H01L 27/0207; G06F 17/5068
USPC ........................................................ 716/121
See application file for complete search history.

(56) References Cited

U.S. PATENT DOCUMENTS

| | | | | |
|---|---|---|---|---|
| 5,541,938 A | * | 7/1996 | Di Zenzo | G06F 11/1012 |
| | | | | 714/6.11 |
| 7,058,864 B1 | * | 6/2006 | McHardy | G11C 29/16 |
| | | | | 714/723 |
| 7,263,027 B2 | * | 8/2007 | Kim | G11C 17/16 |
| | | | | 365/189.15 |
| 8,581,804 B2 | * | 11/2013 | Tyrrell | G09G 3/344 |
| | | | | 345/107 |
| 9,104,341 B2 | * | 8/2015 | Gravelle | G06F 3/0679 |

FOREIGN PATENT DOCUMENTS

| | | |
|---|---|---|
| CN | 101149974 A | 3/2008 |
| CN | 102104045 A | 6/2011 |

OTHER PUBLICATIONS

International Search Report dated Aug. 22, 2013.

* cited by examiner

*Primary Examiner* — Sun Lin
(74) *Attorney, Agent, or Firm* — Polsinelli PC

(57) ABSTRACT

A method of producing a Macro Read Only Memory (MROM) memory based on a One Time Programmable (OTP) memory is provided. The method includes: removing a floating gate of a second P-type Metal Oxide Semiconductor (PMOS) transistor of an OTP memory cell for storing data "0" in an OTP memory map, such that the OTP memory cell being transferred to a MROM memory cell for storing data "0", and retaining an original structure of the OTP memory cell for storing data "1" in the OTP memory map, such that the original structure being used as a MROM memory cell for storing data "1", thus forming a MROM memory map; and producing a MROM memory according to a MROM memory map. The OTP memory map is debugged to determine data which can be changed into the MROM memory map, and an OTP process can be transferred into a MROM process by adjusting only one mask during a producing process.

8 Claims, 5 Drawing Sheets

US 9,397,106 B2

METHOD FOR PRODUCING MROM MEMORY BASED ON OTP MEMORY

RELATED APPLICATIONS

This application is a United States National Stage Application filed under 35 U.S.C 371 of PCT Patent Application Serial No. PCT/CN2013/075364 filed May 9, 2013, which claims priority of Chinese Patent Application Serial No, CN 201210141757.3, filed May 9, 2012, the disclosure of all of which are hereby incorporated by reference in their entireties.

FIELD OF THE INVENTION

The present invention relates to a method of breakdown voltage testing, and particularly relates to a testing method of dynamic breakdown voltage of silicon MOS device on an insulator.

FIELD OF THE INVENTION

The present invention relates to a method of producing a memory, particularly relates to a method of producing a MROM memory based on an OTP memory.

BACKGROUND OF THE INVENTION

As for the consumer electronics products within the developing process, sonic indicators or parameters cannot be completely determined in advance. For example, some soft codes need to be constantly adjusted and changed according to the test result, and they will be determined until the design requirement is met. Accordingly, during the development of this type of chip, an OTP (One Time Programmable) memory is inevitably used. The storage data of the memory cell of the OTP memory is initialized to be "1", which can be written to be "0" by programming according the demand, such that the code can be easily adjusted and changed.

The memory cell of the common logic OTP is composed of two PMOS transistors connected in series, its initial physical implementation is shown in FIG. 1, in which the source of the second TWOS transistor is connected to a source line, the gate is floating and electrically neutralized; the drain is connected to the source of the first PMOS transistor, while the gate of the first PMOS transistor is connected to a strobe terminal, the drain is connected to a bit line, such that the storage data of the memory cell is "1". During the process of programming, a high programming voltage is applied to the drain and the gate of the first PMOS transistor, and the source of the second PMOS transistor is connected to ground. A large number of electrons flow from the source to the drain, thus forming a fairly large current and a large amount of hot electrons. Due to the greater concentration, some electrons reach the silicon dioxide layer between the substrate and the floating gate. Since the gate of the first PMOS transistor is applied with high voltage, the electrons can reach the floating gate through the silicon dioxide layer under the electrical field and form an electron group on the floating gate. The electron group remains on the floating gate even in case of power failure, such that the information can be retained for a long time, thus the writing of "0" is completed, which is shown in FIG. 2. Since the second PMOS transistor with electron on the gate is normally on, during the reading process, there is current flowing between the two PMOS transistors by biasing of the terminal, while the PMOS transistor without electron on the gate is normally off, during the reading process, there is current flowing between the two PMOS transistors. Accordingly, the data can be read by determining the current.

During the process of developing the chip, due to the feature of this type of memory, the test time is very long, and the test cost is very high, which will greatly increase chip production cycle, thus greatly reducing the profit of products after mass production.

SUMMARY OF THE INVENTION

In view of the drawback of the prior art, the present disclosure is directed to a method of producing a MROM (Macro-Read Only Memory) memory based on an OTP memory, which can solve the problem of long test time, complicated producing process and high cost during the development of read-only memory chip.

To achieve the above objectives and other related purposes, the present invention provides a method of producing a MROM memory based on an OTP memory, which at least includes the following steps:

1) providing an OTP memory map, the OTP memory map comprising a plurality of OTP memory cells for storing data "0" and for storing data "1", and each OTP memory cell comprising at least a first PMOS transistor connected in series and a second PMOS transistor having a floating gate;

2) removing the floating gate of the second PMOS transistor of the OTP memory cell for storing data "0" in the OTP memory map, such that the OTP memory cell being transferred to a MROM memory cell for storing data "0", and retaining the original structure of the OTP memory cell for storing data "1" in the OTP memory map, such that the original structure being used as a MROM memory cell for storing data "1", thus forming a MROM memory map; and 3) producing a MROM memory according to the MROM memory map, In the method of producing a MROM memory based on an OTP memory, the OTP memory map is an OTP memory map for achieving the default function and having a determined storage data of each OTP memory cell.

In the method of producing a MROM memory based on an OTP memory, the floating gate of the second PMOS transistor of the OTP memory cell for storing data "0" is electrically negative, and the floating gate of the second PMOS transistor of the OTP memory cell for storing data "1" is electrically neutral.

In the method of producing a MROM memory based on an OTP memory, a source of the first PMOS transistor and a drain of the second PMOS transistor are the same in the OTP memory cell.

In the method of producing a MROM memory based on an OTP memory, during the step 2), after removing the floating gate of the second PMOS transistor of the OTP memory cell for storing data "0", a source, a trench region, and a drain of the second PMOS transistor cooperatively form a source of a third PMOS transistor, the drain and the gate of the first PMOS transistor is configured as a drain and a gate of the third PMOS transistor, thereby the third PMOS transistor is formed to be used as a MROM memory cell for storing data "0".

In the method of producing a. MROM memory based on an OTP memory, when reading data, the drain of the third PMOS transistor is connected to a bit line, the gate is connected to a strobe terminal, the source is connected to a source line.

In the method of producing a MROM memory based on an OTP memory, the MROM memory cell for storing data "1" and the OTP memory cell for storing data "1" have the same structure, which comprises the first PMOS transistor and the second PMOS transistor having the floating gate, a source of the first PMOS transistor and a drain of the second PMOS transistor are the same.

In the method of producing a MROM memory based on an OTP memory, when reading data, the drain of the first PMOS transistor is connected to a bit line, the gate is connected to a strobe terminal; the source of the second PMOS transistor is connected to a source line, the floating gate is left floating.

The method of producing a MROM memory based on an OTP memory has the following advantages, the floating gate of the second PMOS transistor of the OTP memory cell for storing data "0" is removed according to the OTP memory map, such that the OTP memory cell is transferred to a MROM memory cell for storing data "0", and the original structure of the OTP memory cell for storing data "1" is retained in the OTP memory map, such that the original structure is used as a MROM memory cell for storing data "1", thus a MROM memory map is formed, and the MROM memory is produced according to the MROM memory map. According to the present invention, the OTP memory map which is debugged and has determined data can be changed into the MROM memory map, and the OTP process can be transferred into the MROM process by adjusting only one mask during the producing process. The present invention greatly saves the time and cost of the device programming and testing, thus simplifying the process and saving the cost, increasing the profit. Accordingly, the present invention effectively overcomes the shortcomings of the prior art and has a highly industrial value.

COMPONENT LABEL INSTRUCTIONS

101 The drain of the first PMOS transistor of the OTP memory cell for stores "0"
201 The drain of the first PMOS transistor of the OTP memory cell for stores "1"
401 The drain of the first PMOS transistor of the MROM memory cell for stores "1"
102 The gate of the first PMOS transistor of the OTP memory cell for stores "0"
202 The gate of the first PMOS transistor of the OTP memory cell for stores "1"
402 The gate of the first PMOS transistor of the MROM memory cell for stores "1"
103 The source of the first PMOS transistor of the OTP memory cell for stores "0"
203 The source of the first PMOS transistor of the OTP memory cell for stores "1"
403 The source of the first PMOS transistor of the MROM memory cell for stores "1"
104 The gate of the second PMOS transistor of the OTP memory cell for stores "0"
204 The gate of the second PMOS transistor of the OTP memory cell for stores "1"
404 The gate of the second PMOS transistor of the MROM memory cell for stores "1"
105 The source of the second PMOS transistor of the OTP memory cell for stores "0"
205 The source of the second PMOS transistor of the OTP memory cell for stores "1"
405 The source of the second PMOS transistor of the MROM memory cell for stores "1"
108 Electron
301 The drain of the third PMOS transistor
302 The gate of the third PMOS transistor
303 The source of the third PMOS transistor
100, 200, 300, 400 N-type well
106, 206, 406, 304 The bit lines
107, 207, 407, 305 The source lines

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Referring to FIG. 1 to FIG. 5, it should be noted that, in order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings.

Figure 1:
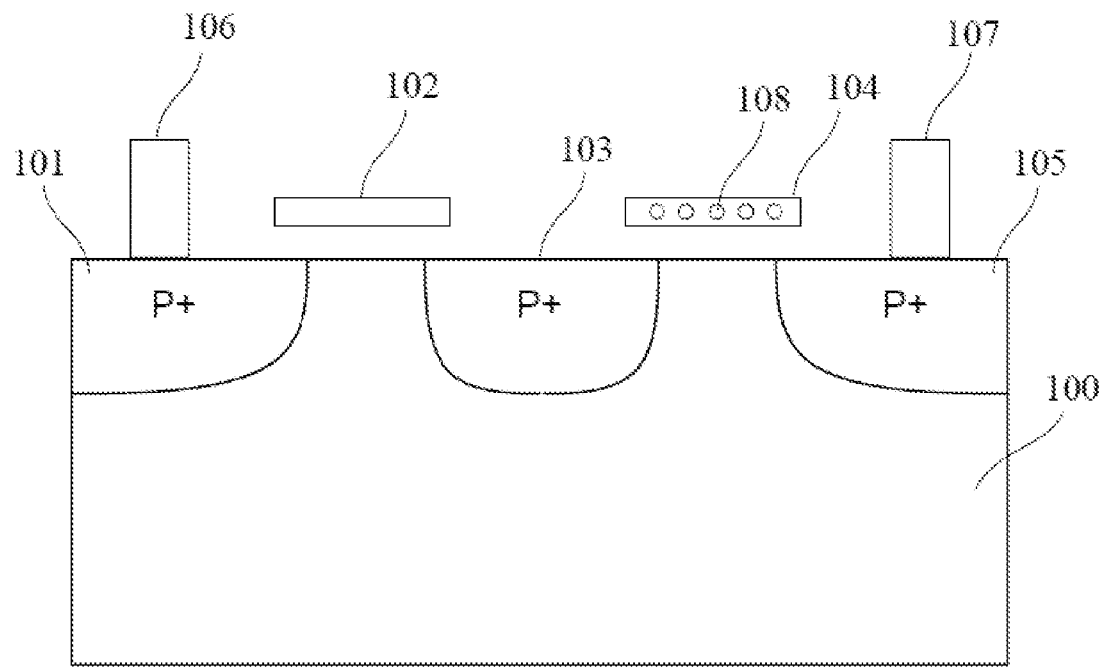
FIG. 1 illustrates a conventional OTP memory cell for storing data "0"
Figure 2:
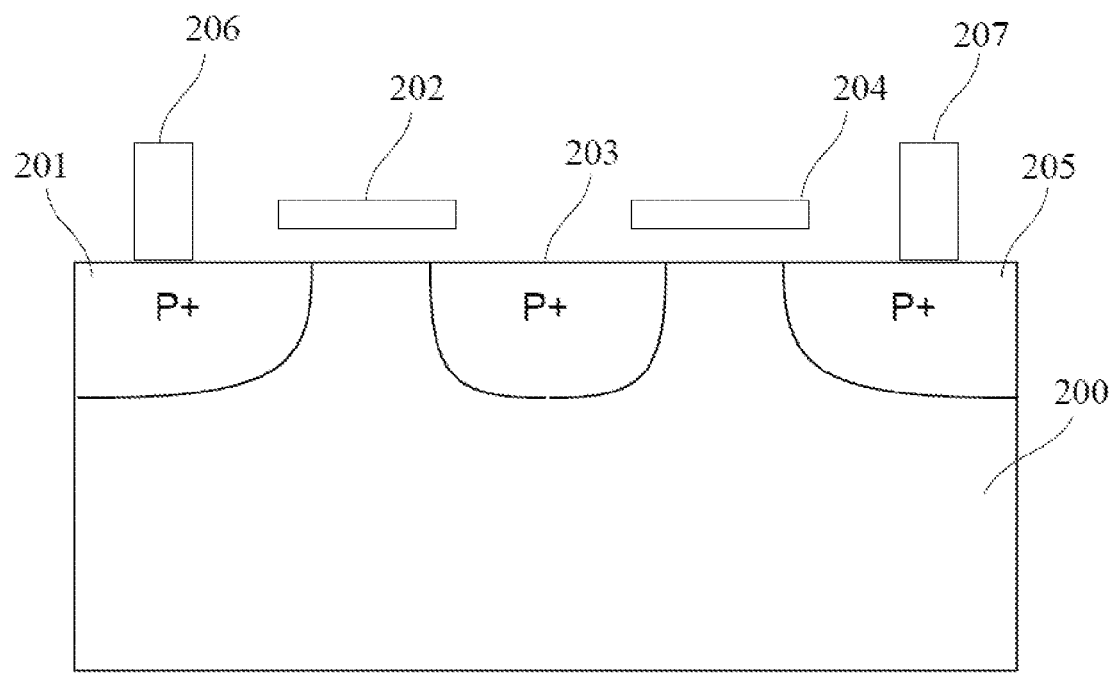
FIG. 2 illustrates a conventional OTP memory cell for storing data "1"
Figure 5:
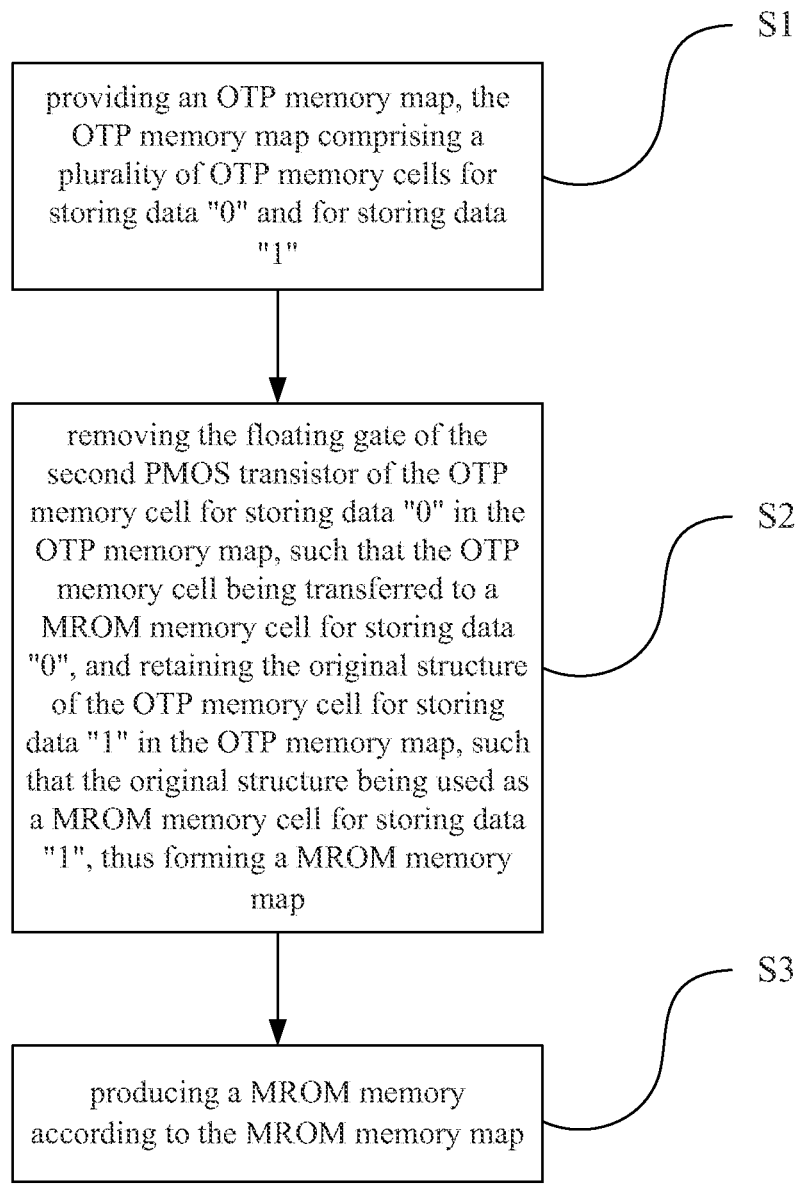
FIG. 5 is a flow chart of a method of producing a MROM memory based on an OTP memory according to the present invention.

Referring to FIG. 1 to FIG. 5, a method of producing a MROM memory based on an OTP memory is provided, which includes at least the following steps:

Referring to FIGS. 1, 2 and 5, step S1 is first executed, an OTP memory map is provided. The OTP memory map includes a plurality of OTP memory cells for storing data "0" and for storing data "1," and each OTP memory cell includes at least a first PMOS transistor connected in series and a second PMOS transistor having a floating gate.

The OTP memory map is an OTP memory map for achieving the default function and having a determined storage data of each OTP memory cell. The default function is determined according to the application environment of the device, such as computer, mobile phone, MP3, camera, and the like. The storage data of each OTP memory cell can be determined to be "0" or "1" according to the default function. However, since certain storage data, such as soft code, cannot be previously determined, it will be determined after testing and adjusting the OTP memory. When all of the storage data is determined, the final OTP memory map will be Obtained. In the illustrated embodiment, the OTP memory map is the final OTP memory map.

The OTP memory cell includes first PMOS transistors connected in series and the second PMOS transistor having the floating gate. A source of the first PMOS transistor and a drain 103 of the second PMOS transistor are the same, and the first PMOS transistor and the second PMOS transistor are formed in a N-type well 100. The floating gate 104 of the second PMOS transistor of the OTP memory cell for storing data "0" is electrically negative due to the massive captured electrons 108, which is configured to make the second PMOS in a normal open state, such that the first PMOS transistor and the second PMOS transistor can be in an on state subjected to biasing effect for storing data "0". The floating gate 204 of the second PMOS transistor of the OTP memory cell for storing data "1" is electrically neutral, such that the second PMOS transistor is in a normal open state for storing data "1".

Figure 3:
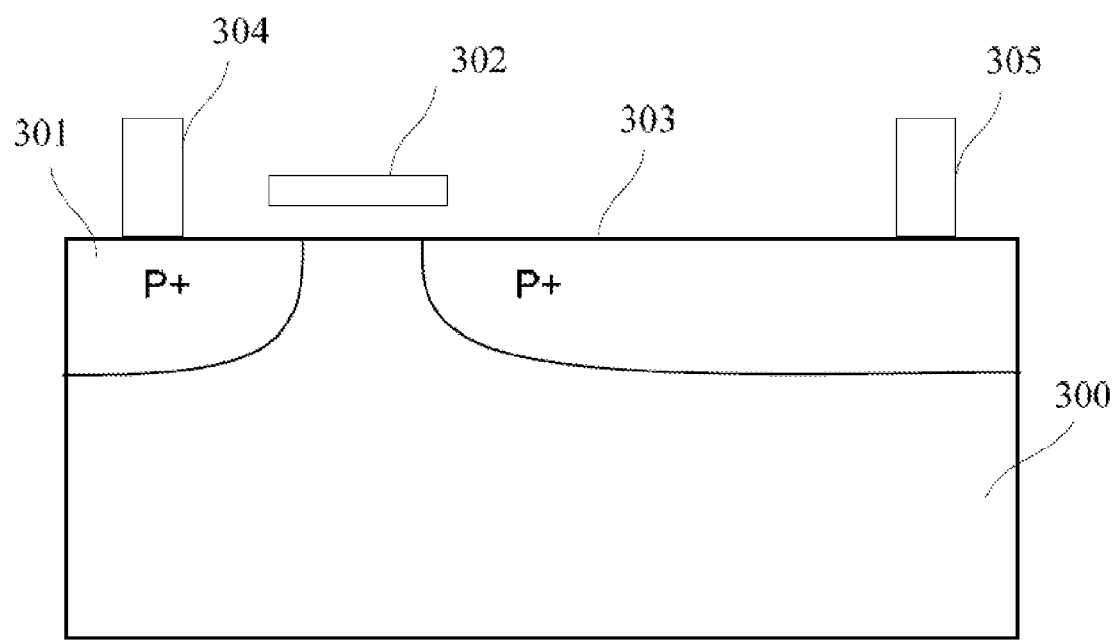
FIG. 3 illustrates a MRON memory cell for storing data "0" according to the present invention.
Figure 4:
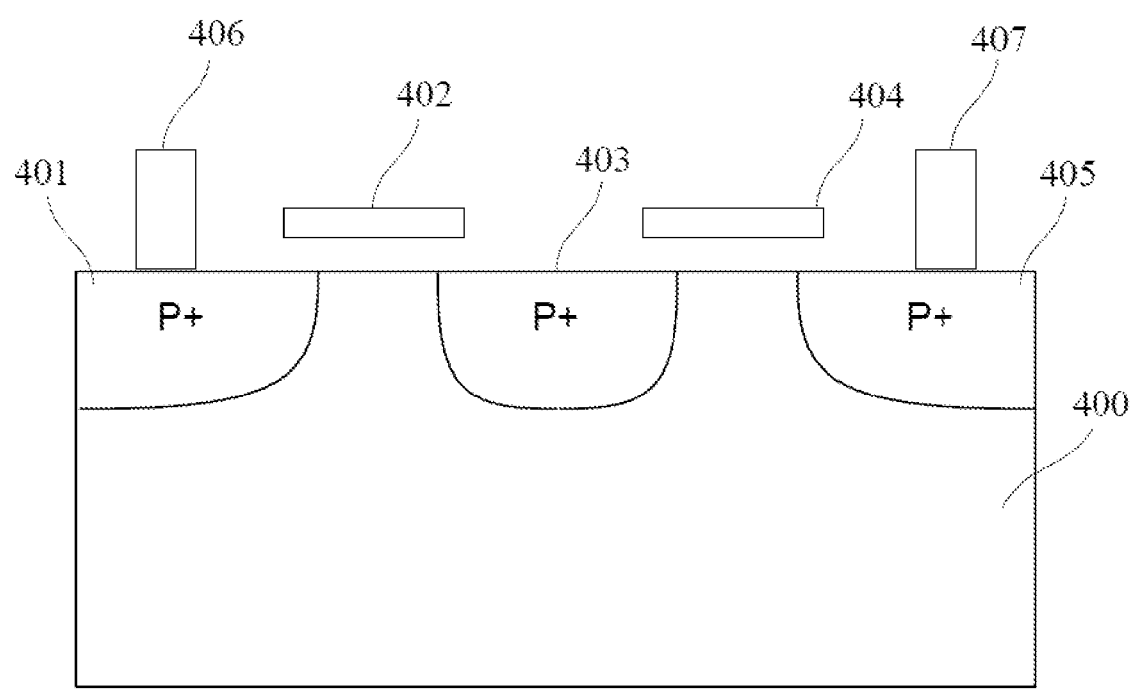
FIG. 4 illustrates a MRON memory cell for storing data "1" according to the present invention.

Referring to FIG. 3 to FIG. 5, step S2 is executed to remove the floating gate 104 of the second PMOS transistor of the OTP memory cell for storing data "0" in the OTP memory map, such that the OTP memory cell is transferred to a MROM memory cell for storing data "0", and the original structure of the OTP memory cell for storing data "1" is retained in the OTP memory map, such that the original structure is used as a MROM memory cell for storing data "1", thus a MROM memory map is formed.

Since the MROM memory cell for storing data "0" is transferred from the original OTP memory map, the floating gate can be removed by adjusting a mask for preparing the floating gate of the second PMOS transistor in the conventional process. After removing the floating gate of the second PMOS transistor of the OTP memory cell for storing data "0", since there is no mask of the gate, when forming the P-type doped region on the substrate by ion implantation, a source, a trench region, and a drain of the second PMOS transistor cooperatively form a P-type doped region, which is used as a source 303 of a third PMOS transistor. The drain 101 and the gate 102 of the first PMOS transistor is configured as a drain 301 and a gate 302 of the third PMOS transistor, and as an MROM memory cell for storing data "0". The MROM memory cell for storing data "0" is composed of a PMOS transistor. When reading data, the drain 301 of the third PMOS transistor is connected to a bit line 304, the gate 302 is connected to a strobe terminal, the source 303 is connected to a source line 305. When the gate is strobed, its source is in an on state, therefore its working principle is the same as that of the OTP cell for storing data "0".

The MROM memory cell for storing data "1" has the same structure as that of the OTP memory cell for storing data "1", which includes a first PMOS transistor and a second PMOS transistor having a floating gate, and a source of the first PMOS transistor and a drain of the second PMOS transistor are the same in the OTP memory cell. When reading data, the drain 401 of the first PMOS transistor is connected to a bit line 406, the gate 402 is connected to a strobe terminal; the source 405 of the second PMOS transistor is connected to a source line 407, the floating gate 404 is left floating. Since the floating gate 404 of the second PMOS transistor is electrically neutral, it is normally in an off state. When the first PMOS transistor is strobed, there is no current between the source line 407 and the bit line 401, thus it can store data "1".

Referring to FIG. 3 to FIG. 5, step S3 is executed to produce a MROM memory according to the MROM memory map.

Since the floating gate of the second PMOS transistor of the OTP memory cell for storing data "0" is removed in the OTP memory map from the MROM memory map, when producing the MROM memory according to the MROM memory map, the original process for producing OTP memory can be retained, and the floating gate can be removed by adjusting a mask for preparing the floating gate of the second PMOS transistor of the OTP memory cell, such that the MROM memory is obtained. The electron capture process of the floating gate of the OTP memory cell is avoided under the premise of ensuring the original function of the device, thus greatly saving the manufacturing time and cost.

In summary, according to the present method of producing a MROM memory based on an OTP memory, the floating gate of the second PMOS transistor of the OTP memory cell for storing data "0" is removed according to the OTP memory map, such that the OTP memory cell is transferred to a MROM memory cell for storing data "0" and the original structure of the OTP memory cell for storing data "1" is retained in the OTP memory map, such that the original structure is used as a MROM memory cell for storing data "1", thus a MROM memory map is formed, and the MROM memory is produced according to the MROM memory map. According to the present invention, the OTP memory map which is debugged and has determined data can be changed into the MROM memory map, and the OTP process can be transferred into the MROM process by adjusting only one mask during the producing process. The present invention greatly saves the time and cost of the device programming and testing, thus simplifying the process and saving the cost, increasing the profit. Accordingly, the present invention effectively overcomes the shortcomings of the prior art and has a highly industrial value.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of producing a Macro Read Only Memory (MROM) memory based on an One Time Programmable (OTP) memory, comprising at least the following steps:
   1) providing an OTP memory map, the OTP memory map comprising a plurality of OTP memory cells for storing data "0" and for storing data "1", and said each OTP memory cell comprising at least a first P-type Metal Oxide Semiconductor (PMOS) transistor connected in series with a second PMOS transistor having a floating gate;
   2) removing the floating gate of the second PMOS transistor of said each OTP memory cell for storing data "0" in the OTP memory map, such that said each OTP memory cell being transferred to a MROM memory cell for storing data "0", and retaining the original structure of said each OTP memory cell for storing data "1" in the OTP memory map, thereby an original structure being used as a MROM memory cell for storing data "1", thus forming a MROM memory map; and
   3) producing a MROM memory according to the MROM memory map.

2. The method of producing a MROM memory based on an OTP memory according to claim 1, wherein the OTP memory map is an OTP memory map for achieving a default function and having a determined storage data of said each OTP memory cell.

3. The method of producing a MROM memory based on an OTP memory according to claim 1, wherein the floating gate of the second PMOS transistor of said each OTP memory cell for storing data "0" is electrically negative, and the floating gate of the second PMOS transistor of said each OTP memory cell for storing data "1" is electrically neutral.

4. The method of producing a MROM memory based on an OTP memory according to claim 1, wherein a source of the first PMOS transistor and a drain of the second PMOS transistor are the same in said each OTP memory cell.

5. The method of producing a MROM memory based on an OTP memory according to claim 1, wherein during the step 2), after removing the floating gate of the second PMOS transistor of said each OTP memory cell for storing data "0", a source, a trench region, and a drain of the second PMOS transistor cooperatively form a source of a third PMOS transistor, a drain and a gate of the first PMOS transistor is configured as a drain and a gate of the third PMOS transistor, thereby the third PMOS transistor is formed to be used as a MROM memory cell for storing data "0".

6. The method of producing a MROM memory based on an OTP memory according to claim 5, wherein when reading data, the drain of the third PMOS transistor is connected to a bit line, the gate of the third PMOS transistor is connected to a strobe terminal, the source of the third PMOS transistor is connected to a source line.

7. The method of producing a MROM memory based on an OTP memory according to claim 1, wherein the MROM memory cell for storing data "1" and said each OTP memory cell for storing data "1" have the same structure, which comprises the first PMOS transistor and the second PMOS transistor having the floating gate, a source of the first PMOS transistor and a drain of the second PMOS transistor are the same.

8. The method of producing a MROM memory based on an OTP memory according to claim 7, wherein when reading data, a drain of the first PMOS transistor is connected to a bit line, a gate of the first PMOS transistor is connected to a strobe terminal; a source of the second PMOS transistor is connected to a source line, the floating gate is left floating.

\* \* \* \* \*